United States Patent
Kitazawa et al.

(10) Patent No.: US 10,498,058 B1
(45) Date of Patent: Dec. 3, 2019

(54) CONNECTOR AND CONNECTOR ASSEMBLY

(71) Applicant: Molex, LLC, Lisle, IL (US)

(72) Inventors: Sho Kitazawa, Yamato (JP); Akihiko Okajima, Yamato (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/383,671

(22) Filed: Apr. 15, 2019

Related U.S. Application Data

(60) Provisional application No. 62/670,065, filed on May 11, 2018.

(30) Foreign Application Priority Data

Dec. 19, 2018 (JP) ................................ 2018-237570

(51) Int. Cl.
| | |
|---|---|
| *H01R 12/71* | (2011.01) |
| *H01R 12/57* | (2011.01) |
| *H01R 13/11* | (2006.01) |
| *H01R 13/6587* | (2011.01) |
| *H05K 1/02* | (2006.01) |
| *H05K 3/32* | (2006.01) |

(Continued)

(52) U.S. Cl.
CPC ......... *H01R 12/716* (2013.01); *H01R 12/57* (2013.01); *H01R 13/11* (2013.01); *H01R 13/502* (2013.01); *H01R 13/6587* (2013.01); *H05K 1/0213* (2013.01); *H05K 3/32* (2013.01); *H01R 13/6581* (2013.01)

(58) Field of Classification Search
CPC ....................... H01R 13/6581; H01R 12/716
See application file for complete search history.

(56) References Cited

U.S. PATENT DOCUMENTS

| | | | | |
|---|---|---|---|---|
| 5,697,799 | A | * 12/1997 | Consoli ............... | H01R 12/716 |
| | | | | 439/181 |
| 6,056,560 | A | * 5/2000 | Wu .................... | H01R 23/6873 |
| | | | | 439/108 |

(Continued)

FOREIGN PATENT DOCUMENTS

| | | | |
|---|---|---|---|
| JP | 2006-059589 A | 3/2006 | |
| JP | WO2018/025873 A1 | * 2/2018 | ........... H01R 12/716 |

*Primary Examiner* — Tho D Ta
(74) *Attorney, Agent, or Firm* — Molex, LLC

(57) ABSTRACT

A connector has a body part and a side wall part which extends in the longitudinal direction, wherein a reinforcing bracket includes: a body part formed on both ends in the longitudinal direction, a side part which is connected to the body part and disposed on a mating guide side wall part on both sides of the mating guide part, and coupling parts which extend in the longitudinal direction with both ends thereof connected to the side part, the side part includes a mating guide engagement part which is engageable with a counterpart mating guide engagement part formed in a counterpart reinforcing bracket installed on a counterpart connector body, the coupling parts include a shield plate part outside the side wall part as well as a supporting part inside the side wall part, and the supporting part includes a supporting engagement part which is engageable with a counterpart supporting engagement part formed in a counterpart supporting part of the counterpart reinforcing bracket.

8 Claims, 12 Drawing Sheets

(51) Int. Cl.
*H01R 13/502* (2006.01)
*H01R 13/6581* (2011.01)

(56) References Cited

U.S. PATENT DOCUMENTS

| | | | |
|---|---|---|---|
| 6,203,365 B1 * | 3/2001 | Wu .................... | H01R 12/716 439/540.1 |
| 7,168,986 B1 * | 1/2007 | Peng .................. | H01R 12/716 439/607.04 |
| 2018/0175561 A1 * | 6/2018 | Chen .................. | H01R 12/707 |

* cited by examiner

US 10,498,058 B1

CONNECTOR AND CONNECTOR ASSEMBLY

RELATED APPLICATIONS

This application claims priority to Japanese Application No. 2018-237570, filed on Dec. 19, 2018, which further claims priority to U.S. Provisional Application No. 62/670,065 filed on May 11, 2018, each of which are incorporated herein by reference in their entirety.

TECHNICAL FIELD

The present disclosure relates to a connector and a connector assembly.

BACKGROUND ART

Conventionally, connectors such as board to board connectors, etc., have been used to electrically connect pairs of parallel circuit boards together. Such connectors are attached to each mutually facing surface on pairs of circuit boards and mated together so as to be connected. Moreover, in order to make it unlikely to be affected by external noise and radio waves and suppress the emission of noise and radio waves to the outside, the technique of providing a shield member is proposed (for example, see Patent Document 1). FIG. 12 is a perspective view illustrating a conventional connector shield member.

In the figure, 851 is a first side shield member for shielding the side faces of a housing of a first connector mounted on a first circuit board (not illustrated), while 856 is a first end side shield member for shielding the end sides of the housing of the first connector. In addition, the first side shield member 851 and the first end side shield member 856 are conducted when the end part 852 of the first side shield member 851 contacts a bent part 857 on both sides of the first end side shield member 856.

Moreover, 951 is a second side shield member for shielding the side faces of a housing of a second connector mounted on a second circuit board (not illustrated), while 956 is a second end side shield member for shielding the end sides of the housing of the second connector. Because the second connector is a connector housed in a recess of the housing of the first connector, the second side shield member 951 and the second end side shield member 956 are positioned inside the first side shield member 851 and the first end side shield member 856, as illustrated in the figure, with the second connector mating with the first connector. In addition, the second side shield member 951 and the second end side shield member 956 are conducted when the end part 952 of the second shield member 951 contacts a bent part 957 on both sides of the second end side shield member 956.

Further, with the second connector mating with the first connector, the second side shield member 951 and the second end side shield member 956 are conducted with the first side shield member 851 and the first end side shield member 856 such that a protrusion (not illustrated) formed in a contact piece 854 formed in the vicinity of an end part 852 in the first side shield member 851 engages with a hole 954 formed in the contact piece 854 formed in the vicinity of an end part 952 in the second side shield member 951, with a contact piece 858 of the first end side shield member 856 engaging with a contact piece 958 of the second end side shield member 956. Consequently, the shield has a double structure, enabling the generation of noise leakage and communication failures to be prevented.

Patent Document 1: JP 2006-059589 A

SUMMARY

However, in conventional connectors, a shield member of a first connector engages with a shield member of a second connector in the vicinity of both ends in the longitudinal direction, with engagement not occurring in other parts. Therefore, because the extraction force required to extract the mating connector from a counterpart connector is particularly weak in the middle part in the longitudinal direction, if subjected to external force to release the mating of connectors, the mating may be released.

Here, in order to solve the problems of conventional connectors, an object is to provide a connector (which is securely locked to a mated counterpart connector, securely maintains the mating with the counterpart connector, and provide high reliability) as well as a connector assembly.

Accordingly, a connector includes: a connector body, a terminal installed on the connector body, and a reinforcing bracket installed on the connector body; wherein the connector body includes: a recess which mates with a counterpart connector body of a counterpart connector, a side wall part which extends in the longitudinal direction and defines both sides of the recess, and a mating guide part which is formed on both ends in the longitudinal direction, with a mating recess formed therein, wherein a counterpart mating guide part formed on both ends in the longitudinal direction of the counterpart connector body is inserted into the mating recess; wherein the reinforcing bracket includes: a body part formed on both ends in the longitudinal direction, a side part which is connected to the body part and disposed on a mating guide side wall part on both sides of the mating guide part, and coupling parts which extend in the longitudinal direction with both ends thereof connected to the side part; and wherein the side part includes a mating guide engagement part which is engageable with a counterpart mating guide engagement part formed in a counterpart reinforcing bracket installed on the counterpart connector body, the coupling parts include a shield plate part outside the side wall part as well as a supporting part inside the side wall part, and the supporting part includes a supporting engagement part which is engageable with a counterpart supporting engagement part formed in a counterpart supporting part of the counterpart reinforcing bracket.

Further, in another connector, the supporting engagement part is a recessed groove or a protrusion which extends in the longitudinal direction.

Further, in still another connector, the supporting engagement part is continuously or intermittently formed in the longitudinal direction.

Further, in still another connector, the supporting part abuts or approaches the inner side face of the side wall part.

Further, in still another connector, the shield plate part is spaced apart from the outer side face of the side wall part.

Further, in still another connector, the shield plate part abuts or approaches the outer side face of the side wall part.

Further, in still another connector, the connector body includes a projection which is within the recess and mates with a recessed groove of the counterpart connector body, while the terminal includes a contact part which is exposed on the side face facing the side wall part in the projection and contacts a counterpart terminal of the counterpart connector at a single location.

A connector assembly includes: the connector, and the counterpart connector mating with the connector.

According to the present disclosure, a connector is securely locked to a mated counterpart connector. Accordingly, the mating between a connector and a counterpart connector is securely maintained, improving reliability.

BRIEF DESCRIPTION OF DRAWINGS

FIGS. 7A-7D are four plane views of a state in which the first connector and the second connector according to Embodiment 1 are mated, wherein FIG. 7A is a plan view as seen from above the first connector, FIG. 7B is the arrow direction cross sectional view along line A-A of FIG. 7A, FIG. 7C is the arrow direction cross sectional view along line B-B of FIG. 7A, and FIG. 7D is the arrow direction cross sectional view along line C-C of FIG. 7A.

FIGS. 11A-11D are four plane views of a state in which the first connector and the second connector according to Embodiment 2 are mated, wherein FIG. 11A is a plan view as seen from above the first connector, FIG. 11B is the arrow direction cross sectional view along line D-D of FIG. 11A, FIG. 11C is the arrow direction cross sectional view along line E-E of FIG. 11A, and FIG. 11D is the arrow direction cross sectional view along line F-F of FIG. 11A.

DETAILED DESCRIPTION OF THE PREFERRED EMBODIMENTS

Embodiments will be described in detail below with reference to drawings.

Figure 1:
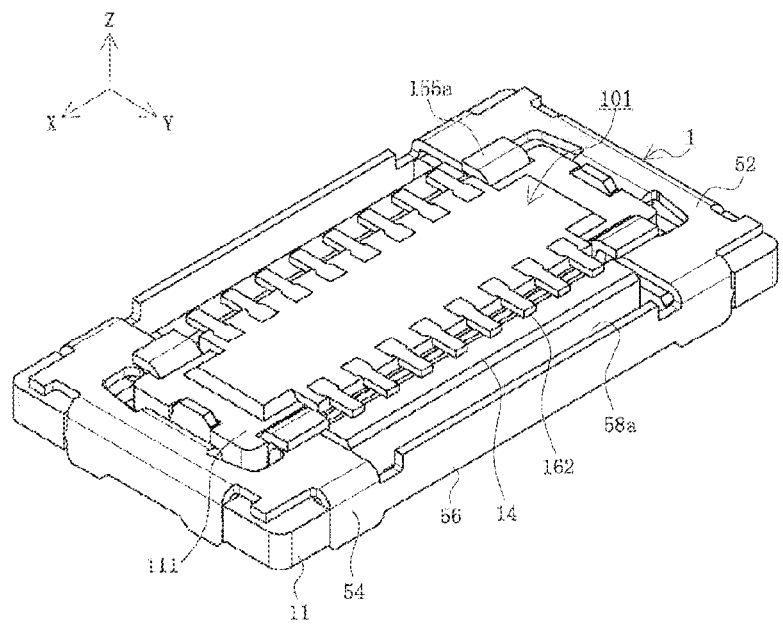
FIG. 1 is a perspective view of a state in which a first connector and a second connector according to Embodiment 1 are mated.
Figure 2:
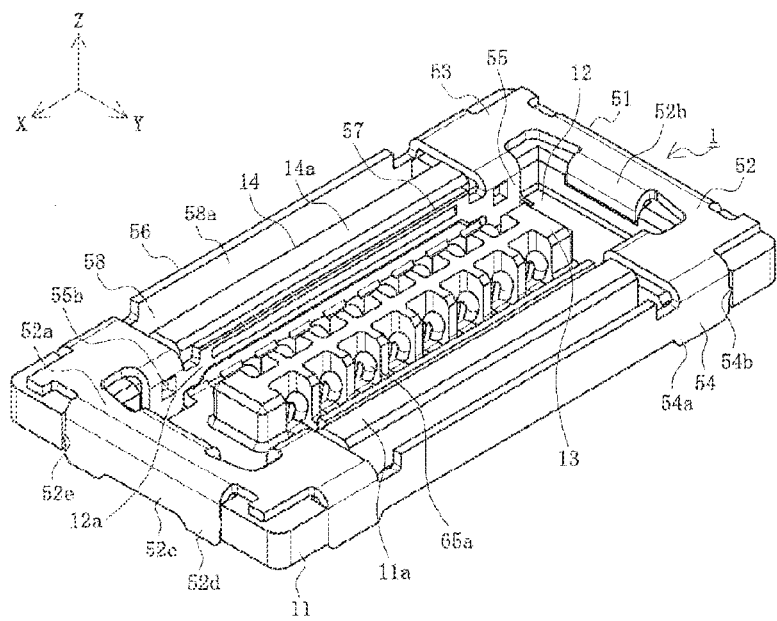
FIG. 2 is a perspective view of the first connector according to Embodiment 1.
Figure 3:
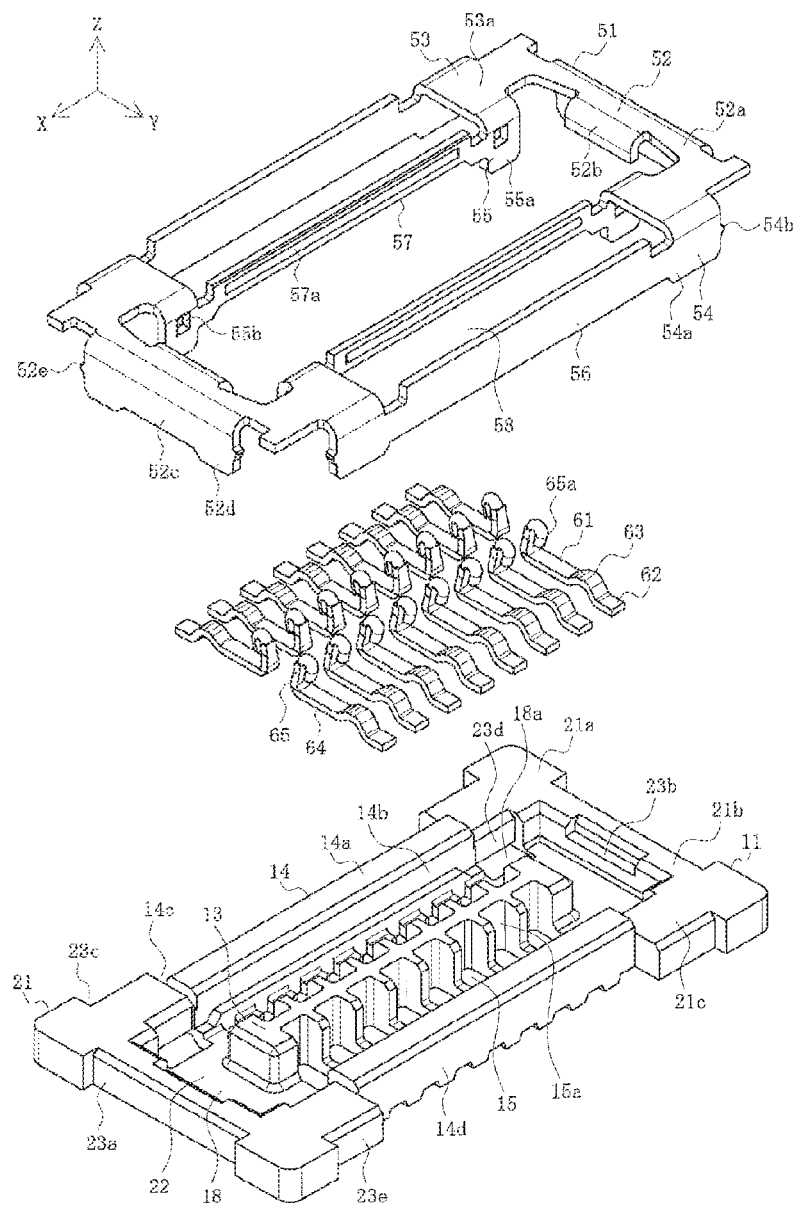
FIG. 3 is an exploded view of the first connector according to Embodiment 1.
Figure 4:
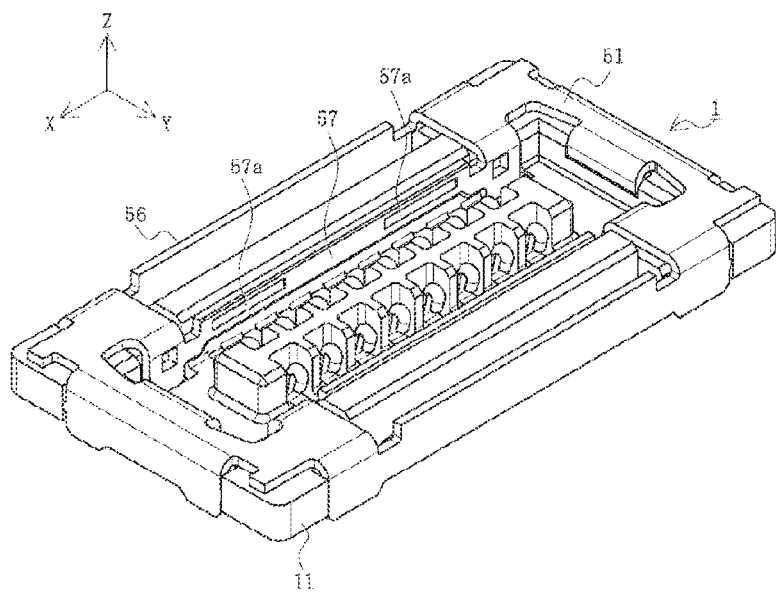
FIG. 4 is a perspective view of a modified example of the first connector according to Embodiment 1.
Figure 5:
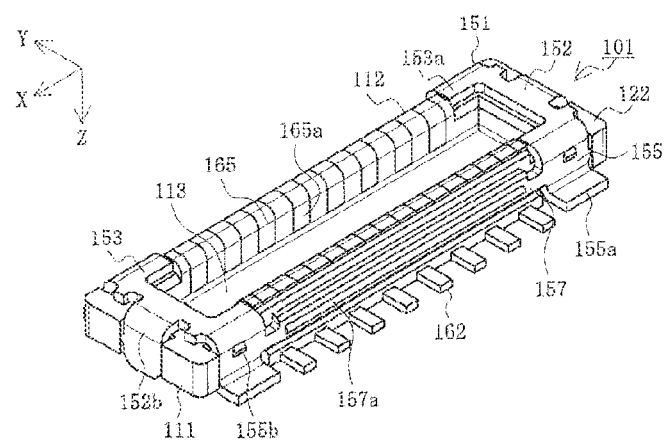
FIG. 5 is a perspective view of a second connector according to Embodiment 1.
Figure 6:
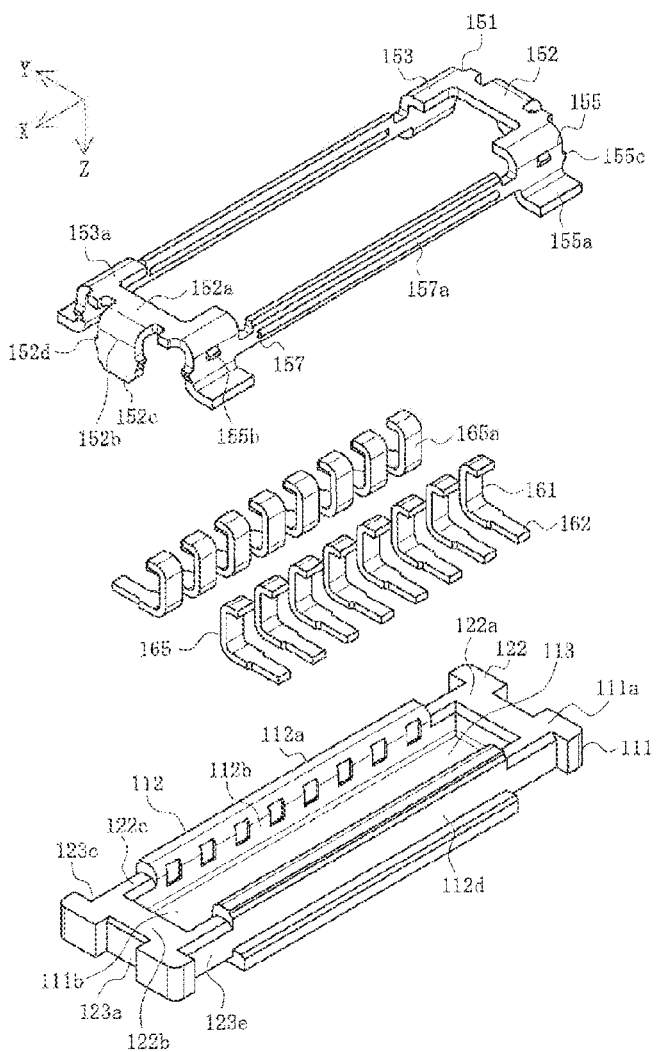
FIG. 6 is an exploded view of the second connector according to Embodiment 1.
Figure 7A:
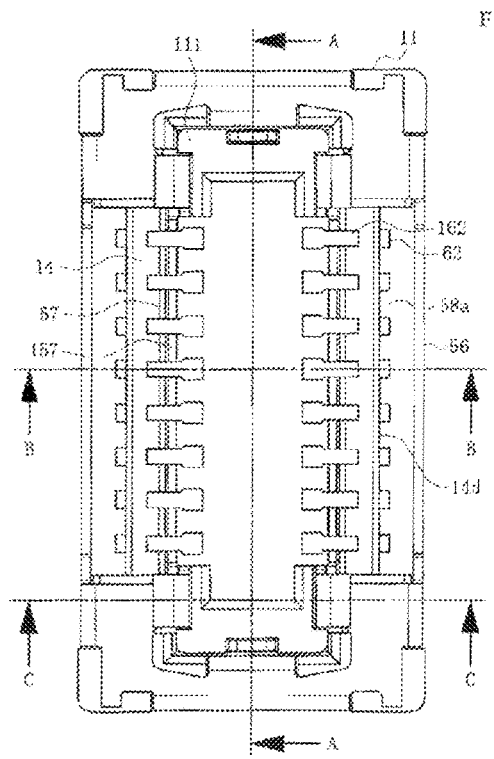
Figure 7B:
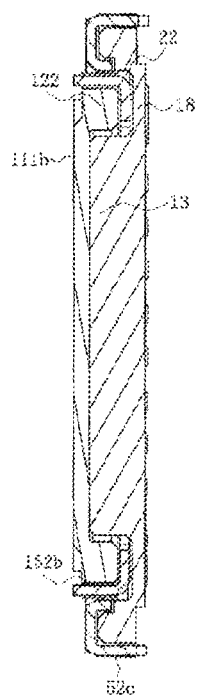
Figure 7C:
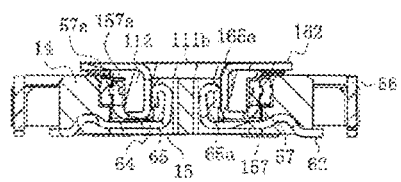
Figure 7D:
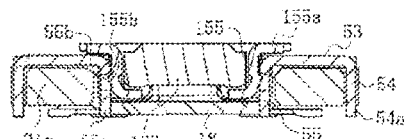

FIG. 1 is a perspective view of a state in which a first connector and a second connector according to Embodiment 1 are mated, FIG. 2 is a perspective view of the first connector according to Embodiment 1, FIG. 3 is an exploded view of the first connector according to Embodiment 1, FIG. 4 is a perspective view of a modified example of the first connector according to Embodiment 1, FIG. 5 is a perspective view of a second connector according to Embodiment 1, FIG. 6 is an exploded view of the second connector according to Embodiment 1, and FIGS. 7A-7D are four plane views of a state in which the first connector and the second connector according to Embodiment 1 are mated. Note that in FIG. 7A is a plan view as seen from above the first connector, FIG. 7B is the arrow direction cross sectional view along line A-A of FIG. 7A, FIG. 7C is the arrow direction cross sectional view along line B-B of FIG. 7A, and FIG. 7D is the arrow direction cross sectional view along line C-C of FIG. 7A.

In the figure, 1 is a connector of the present embodiment and is the first connector serving as one of a pair of board to board connectors serving as a connector assembly. The first connector 1 is a surface mount type connector mounted on the surface of a first substrate (not illustrated) that serves as a mounting member and is mated to a second connector 101 that serves as a counterpart connector. Furthermore, the second connector 101 is the other of the pair of board to board connectors and is a surface mount type connector mounted on the surface of a second substrate (not illustrated) that serves as a mounting member.

Note that while the first connector 1 and the second connector 101 are ideally used for electrically connecting the first substrate and the second substrate serving as substrates, the connectors can also be used to electrically connect other members. Examples of the first substrate and the second substrate include printed circuit boards, flexible flat cables (FFC), flexible printed circuit boards (FPC), etc. used in electronic equipment, etc., but may be any type of substrate.

Furthermore, expressions indicating directions such as up, down, left, right, front, and back used to describe the operations and configurations of the parts of the first connector 1 and the second connector 101 in the present embodiment are not absolute but rather relative directions, and though appropriate when the parts of the first connector 1 and the second connector 101 are in the positions illustrated in the figures, these directions should be interpreted differently when these positions change in order to correspond to said change.

Furthermore, the first connector 1 has a first housing 11 as a connector body integrally formed of an insulating material such as synthetic resin. As illustrated in the figure, the first housing 11 is a substantially rectangular body having a substantially rectangular thick plate shape, wherein a first recess 12 serving as a substantially rectangular recess surrounded by a periphery and mating with a second housing 111 of the second connector 101 is formed on the side of the housing in which the second connector 101 fits, that is, on the mating face 11a side (Z axis positive direction side). In addition, a first projection 13 as a projection mating with a recessed groove 113 of the second connector 101 in this first recess 12 is integrally formed with the first housing 11, while a first side wall part 14 as a side wall part, which extends parallel to the first projection 13 on both sides (Y axis positive direction side and negative direction side) of this first projection 13 and defines both sides of the first recess 12, is integrally formed with the first housing 11.

In this case, the first projection 13 and the first side wall part 14 protrude upward from a bottom plate 18 which defines the bottom face of the first recess 12 (Z axis positive direction) and extends in the longitudinal direction (X axis direction) of the first housing 11. Consequently, a recessed groove 12a as an elongated recess which extends in the longitudinal direction of the first housing 11 as a portion of the first recess 12 is formed on both sides of the first projection 13.

Here, first terminal housing cavities 15 are formed from the side faces on both sides of the first projection 13 to the bottom face of the recessed groove 12a. In the illustrated example, the first terminal housing cavities 15 are formed so as to penetrate through the bottom plate 18 in the plate thickness direction (Z axis direction). Note that in the first terminal housing cavities 15, recessed groove parts formed on the side faces on both sides of the first projection 13 are referred to as first terminal housing inner cavities 15a.

In the present embodiment, a plurality (for example, 8) of the first terminal housing cavities 15 are each formed at a predetermined pitch on both sides of the first projection 13 so as to form two rows in the longitudinal direction of the first housing 11. Note that the pitch and number of the first terminal hosing cavities 15 can be appropriately changed. In addition, a plurality of first terminals 61 as terminals which are housed in each of the first terminal housing cavities 15 and installed on the first housing 11 are disposed on both sides of the first projection 13 at the same pitch.

Each of the first terminals 61 is a member integrally formed by carrying out processing such as punching and bending on the conductive metal plate and includes: a first holding part 63 serving as a holding part held by the first housing 11; a first tail part 62 serving as a tail part connected to one end of this first holding part 63; a first connecting part 64 connected to the other end of the first holding part 63; a first contact arm 65 connected to the tip of this first connecting part 64; and a first contact part 65a serving as a contact part formed at the tip of this first contact arm 65, that is, a free end.

In addition, the first terminal 61 is integrated with the first housing 11 by overmolding or insert molding. That is, the first housing 11 is molded by filling the cavity of a mold, in which the first terminal 61 has been set beforehand, with an insulating material such as synthetic resin. Consequently, the first terminal 61 is integrally attached to the first housing 11, with at least the first holding part 63 embedded in the first housing 11. Note that the first terminal 61 is not necessarily integrated with the first housing 11 by overmolding or insert molding and may be attached to the first housing 11 by press fitting, etc., wherein, for convenience of description, the case of integration with the first housing 11 by overmolding or insert molding will be described.

The first holding part 63 is a member which generally extends in the left and right direction (Y axis direction), that is, in the width direction of the first housing 11, but is bent so as to expand upward (in the Z axis positive direction), allowing it to be embedded and held in the first side wall part 14. Moreover, the first tail part 62 stretches in the left and right direction from one end of the first holding part 63, more specifically, stretches outwardly in the width direction of the first housing 11, and is connected to a connection pad coupled to a conductive trace of the first substrate by soldering, etc. Note that the conductive trace is typically a signal line. Further, the first connecting part 64 stretches in the left and right direction from one end of the first holding part 63, more specifically, stretches inwardly in the width direction of the first housing 11. Further, the first contact arm 65 stretches upward from the tip of the first connecting part 64, with the first contact part 65a formed in the vicinity of the upper end thereof and bent at 180° so as to form a U shape and expand outwardly in the width direction of the first housing 11.

The first terminal 61 is fixed to the first housing 11, with at least most of the first holding part 63 embedded in the first side wall part 14 and with at least most of the first connecting part 64 and the first contact arm 65 housed in the first terminal housing cavities 15. In this state, that is, with the first terminal 61 installed in the first housing 11, the first contact part 65a is directed outwardly in the width direction of the first housing 11 so as to be exposed on the side face facing the first side wall part 14 in the first projection 13. Specifically, at least a portion of the first contact part 65a protrudes from the first terminal housing inner cavities 15a into the recessed groove 12a.

Note that the first terminal 61 is a member which is integrally formed by processing a metal plate and therefore has a certain degree of elasticity. In addition, as is clear from the shape, the first connecting part 64, the first contact arm 65, and the first contact part 65a can be elastically deformed. Accordingly, if a second side wall part 112 of the second connector 101 with a second terminal 161 attached thereto is inserted into the recessed groove 12a, the first contact part 65a contacting the second terminal 161 is elastically displaced inwardly in the width direction of the first housing 11.

Moreover, each first protruding end part 21 as a mating guide part is disposed on both ends in the longitudinal direction of first housing 11. A mating recess 22 as a portion of the first recess 12 is formed on each first protruding end part 21. The mating recess 22 is a substantially rectangular recess connected to both ends in the longitudinal direction of each recessed groove 12a. Additionally, in the state in which the first connector 1 and the second connector 101 are mated, a second protruding end part 122 contained in second connector 101 is inserted into the mating recess 22.

Further, the first protruding end part 21 includes: a first side wall extension 21c as a mating guide side wall part which stretches in the longitudinal direction of the first housing 11 from both ends in the longitudinal direction of the first side wall part 14; and a first end wall 21b which extends in the width direction of the first housing 11 with both ends thereof connected to the first side wall extension 21c. In each first protruding end part 21, the first end wall 21b and the first side wall extension 21c connected to both ends thereof form a continuous substantially U shaped side wall and define three sides of a substantially rectangular mating recess 22. In addition, in the first end wall 21b, an outer end recess 23a as a recessed first central foot housing part is formed on the outer side face, while a recessed inner end recess 23b is formed on the inner side face. Moreover, in the first side wall extension 21c, an outer side recess 23c as a recessed first side plate housing part is formed on the outer side face, while an inner side recess 23d as a recessed inner plate housing part is formed on the inner side face. Further, a bottom opening 18a as an inner plate passage hole which penetrates through the bottom plate 18 in the plate thickness direction is formed at the position corresponding to the lower end of the inner side recess 23d on the bottom plate 18 defining the bottom face of the mating recess 22.

In addition, a first reinforcing bracket 51 as a reinforcing bracket installed thereto is attached to the first housing 11. In the present embodiment, the first reinforcing bracket 51 is a member integrally formed by carrying out processing such as punching and bending on the metal plate, is positioned on both ends in the longitudinal direction (X axis direction) of the first housing 11, and includes: a first body part 52 serving as a body part covering the upper face of the first end wall 21b of the first protruding end part 21; a first side part 53 serving as a side part connected to both the left and right ends of each first body part 52; and a shield plate part 56 as a first coupling part and a first supporting part 57 as a supporting part, which serve as a coupling part which couples the mutual first side part 53 in the vicinity of both ends in the longitudinal direction of the first housing 11.

The first body part 52 includes: a first body upper face part 52a which extends in the width direction of the first housing 11 and covers the majority of the upper face 21a of the first end wall 21b; an end wall inner cover part 52b as a tongue part which stretches downward from the inner end edge of the first end wall 21b in this first body upper face part 52a;

an end wall outer cover part 52c as a first central foot which stretches downward from the outer end edge of the first end wall 21b in the first body upper face part 52a; a first central connection foot 52d which stretches downward from the lower end of this end wall outer cover part 52c; and an engagement projection 52e formed at the side end of the end wall outer cover part 52c.

In addition, with the first reinforcing bracket 51 attached to the first housing 11, the first body upper face part 52a covers the majority of the upper face 21a of the first end wall 21b, at least a portion of the end wall inner cover part 52b is housed in the inner end recess 23b, most of the end wall outer cover part 52c is housed in the outer end recess 23a, and the engagement projection 52e engages with the side wall of the outer end recess 23a so as to be fixed into the outer end recess 23a. Note that the lower end of the first central connection foot 52d protrudes downward so as to be connected to a connection pad coupled to a ground trace of the first substrate by soldering, etc. Consequently, the first reinforcing bracket 51 tends not to be deformed, with the first connector 1 effectively reinforced. Moreover, the end wall inner cover part 52b is a member which protects the first end wall 21b from collision due to the mating when the first connector 1 mates with the second connector 101 and has a guide function of appropriately guiding a second protruding end part 122 possessed by the second connector 101 into the mating recess 22, with the end wall inner cover part 52b capable of being appropriately omitted.

The first side part 53 includes: a first side upper face part 53a which extends in the longitudinal direction of the first housing 11 and covers the majority of the upper face of the first side wall extension 21c; a first side plate part 54 which stretches downward from the outward end in the width direction of the first housing 11 in this first side upper face part 53a; a first side plate connection foot 54a which stretches downward from the lower end of this first side plate part 54; an engagement projection 54b formed at the side end of the first side plate part 54; an inner plate part 55 which stretches downward from the inward end in the width direction of the first housing 11 in the first side upper face part 53a; an inner plate connection foot 55a which stretches downward from the lower end of this inner plate part 55; and an engaging recess 55b as a mating guide engagement part formed in the inner plate part 55.

In addition, with the first reinforcing bracket 51 attached to the first housing 11, the first side upper face part 53a covers the majority of the upper face of the first side wall extension 21c, the first side plate part 54 is housed in the outer side recess 23c of the first side wall extension 21c and covers a side face 23e of this outer side recess 23c, the engagement projection 54b engages with the side wall of the outer side recess 23c so as to be fixed into the outer side recess 23c, and the lower end of the first side plate connection foot 54a protrudes downward so as to be connected to the connection pad coupled to the ground trace of the first substrate by soldering, etc. Consequently, the first reinforcing bracket 51 tends not to be deformed, with the first connector 1 effectively reinforced. Moreover, the inner plate part 55 is housed in the inner side recess 23d of the first side wall extension 21c, the inner plate connection foot 55a passes through the bottom opening 18a, and the lower end thereof protrudes downward so as to be connected to a connection pad coupled to a ground trace of the first substrate by soldering, etc. Consequently, the first reinforcing bracket 51 tends not to be deformed, with the first connector 1 effectively reinforced. Note that the upper face of the first side wall extension 21c is formed so as to be flush with the upper face 21a of the first end wall 21b and lower than the upper face 14a of the first side wall part 14, while the upper face of the first side upper face part 53a covering the upper face of the first side wall extension 21c is substantially flush with the upper face 14a of the first side wall part 14.

Further, while not all of the first central connection foot 52d, the first side plate connection foot 54a, and the inner plate connection foot 55a are necessarily connected to a connection pad of the first substrate, the connection to any connection pad can be omitted in accordance with the circuit design of the first substrate, etc. Moreover, the bottom opening 18a and the inner plate connection foot 55a which passes through this bottom opening 18a can be appropriately omitted.

The shield plate part 56 and the first supporting part 57 as the first coupling part are spaced apart from each other in the width direction of the first housing 11, with a first side wall housing space 58 disposed therebetween. In addition, the shield plate part 56 is an elongated flat belt shaped plate which extends in the thickness direction (Z axis direction) and the longitudinal direction of the first housing 11 with both ends thereof connected to and substantially flush with the first side plate part 54. Note that the dimension regarding the thickness direction of the first housing 11 of the shield plate part 56 is substantially the same as the thickness of the first housing 11. Moreover, the first supporting part 57 is an elongated flat belt shaped plate which extends in the thickness direction and the longitudinal direction of the first housing 11 with both ends thereof connected to and substantially flush with the inner plate part 55. Moreover, a connection foot connected to the connection pad may be formed at the lower end of the shield plate part 56, wherein the shield plate part 56 may be connected to the connection pad. Note that the dimension regarding the thickness direction of the first housing 11 of the first supporting part 57 is set so as to be smaller than the shield plate part 56.

Moreover, a recessed groove 57a as a supporting engagement part which extends in the longitudinal direction of the first housing 11 is formed on the inward face in the width direction of the first housing 11 in the first supporting part 57. Note that the supporting engagement part is not necessarily a recessed groove such as the recessed groove 57a, but may be a protrusion, wherein the case of a recessed groove such as the recessed groove 57a will be described. Further, the recessed groove 57a, in the examples as illustrated in FIGS. 2 and 3, is continuously formed over substantially the overall length of the first supporting part 57, but is not necessarily formed over substantially the overall length of the first supporting part 57, may be partially formed as illustrated in FIG. 4, is not necessarily continuously formed, and may be intermittently formed, wherein, for convenience of description, the case of the continuous formation over substantially the overall length of the first supporting part 57 will be described.

In addition, with the first reinforcing bracket 51 attached to the first housing 11, the shield plate part 56 covers the outside in the width direction of the first housing 11 in the first side wall part 14. However, because a side wall recess 14c recessed thereinside is formed outside in the width direction of the first housing 11 in the first side wall part 14, the first side wall part 14 is formed so as to be narrower than the first side wall extension 21c and the first side wall housing space 58, while the outer side face 14d of the first side wall part 14 is positioned inside in the width direction of the first housing 11 compared with the side face 23e of the outer side recess 23c of the first side wall extension 21c. Therefore, the shield plate part 56 which is substantially flush with the first side plate part 54 covering the side face 23e of the outer side recess 23c of the first side wall extension 21c is spaced apart from the outer side face 14d of the first side wall part 14, with a side gap 58a formed between the shield plate part 56 and the outer side face 14d of the first side wall part 14. In addition, in a plan view (on the X-Y plane), the first tail part 62 of the first terminal 61 protrudes outwardly from the outer side face 14d of the first side wall part 14 in the width direction of the first housing 11 and is positioned within the side gap 58a inside the shield plate part 56. Accordingly, the overall first terminal 61 is positioned inside the shield plate part 56 in the width direction of the first housing 11 so as to be isolated from the outside, improving the shielding properties of the first connector 1. Further, the first side wall part 14 holding the first terminal 61 is surrounded by the shield plate part 56 and the first supporting part 57, with both sides thereof connected to each other, thereby further improving the shielding properties of the first connector 1.

Moreover, with the first reinforcing bracket 51 attached to the first housing 11, the first supporting part 57 covers the inner side face 14b of the first side wall part 14. The outward face in the width direction of the first housing 11 in the first supporting part 57 abuts or approaches the inner side face 14b of the first side wall part 14, while the inward face in the width direction of the first housing 11 of the first supporting part 57 serves as a portion of the side face facing the first projection 13 in the recessed groove 12a. Accordingly, because the first side wall part 14 is reinforced by the first supporting part 57, even if the dimension in the width direction of the first housing 11 is small, that is, thin, it is not deformed. Moreover, because the first supporting part 57 has the recessed groove 57a formed therein, giving it a large section modulus and high strength, the first side wall part 14 is more effectively reinforced.

Next, the configuration of the second connector 101 will be described. The second connector 101 as a counterpart connector according to the present embodiment has the second housing 111 as a counterpart connector body integrally formed of an insulating material such as synthetic resin. As illustrated in the figure, this second housing 111 is a substantially rectangular body with the shape of a substantially rectangular thick plate. In addition, on the side of the second housing 111 which fits in the first connector 1, that is, the mating surface 111a side (Z axis negative direction side), an elongated recessed groove 113 which extends in the longitudinal direction (X axis direction) of the second housing 111 is integrally formed with a second side wall part 112 serving as an elongated projection which defines the outside of this recessed groove 113 and extends in the longitudinal direction of the second housing 111. This second side wall part 112 is formed along both sides of the recessed groove 113 and along both sides of the second housing 111. Additionally, a second terminal 161 as a counterpart terminal is disposed in each second side wall part 112. The second terminal 161 is disposed at the pitch corresponding to the first terminal 61 and in the number corresponding thereto. The recessed groove 113 is closed by a bottom plate 111b on the side mounted on a second substrate, that is, the mounting surface side (Z axis positive direction side).

The second terminal 161 is a member integrally formed by carrying out processing such as punching and bending on the conductive metal plate and includes a second connecting part 165 as well as a second tail part 162 connected to this second connecting part 165. In addition, the second terminal 161 is integrated with the second housing 111 by overmolding or insert molding That is, the second housing 111 is molded by filling the cavity of a mold, in which the second terminal 161 has been set beforehand, with an insulating material such as synthetic resin. As a result, at least a portion of the second terminal 161 is embedded in the second housing 111 so as to be integrally attached to the second housing 111. Note that the second terminal 161 is not necessarily integrated with the second housing 111 by overmolding or insert molding and may be attached to the second housing 111 by press fitting, etc., wherein, for convenience of description, the case of the integration with the second housing 111 by overmolding or insert molding will be described.

The second connecting part 165 is a member having a substantially U shape when viewed from the side, wherein the part which extends in the left and right direction (Y axis direction) is connected to both the up and down ends of the part which extends in the up and down direction (Z axis direction), and wherein at least a portion of the inward surface in the width direction of the second housing 111 in the part which extends in the up and down direction is exposed on the inner side face 112b of the second side wall part 112 so as to function as a second contact part 165a serving as a counterpart contact part. This second contact part 165a is substantially flush with the inner side face 112b of the second side wall part 112. Moreover, the second tail part 162 stretches in the left and right direction from the tip of the part which extends in the left and right direction on the lower side of the second connecting part 165, more specifically, stretches outwardly in the width direction of the second housing 111, and is connected to a connection pad coupled to a conductive trace of the second substrate by soldering, etc. Note that the conductive trace is typically a signal line.

Moreover, each second protruding end part 122 as a counterpart mating guide part is disposed on both ends in the longitudinal direction of the second housing 111. This second protruding end part 122 is a thick member which extends in the width direction (Y axis direction) of the second housing 111, with both ends thereof connected to both ends in the longitudinal direction of each second side wall part 112. Additionally, in the state in which the first connector 1 and the second connector 101 are mated, the second protruding end part 122 functions as an insertion protrusion inserted into the mating recess 22 of the first protruding end part 21 contained in the first connector 1.

Further, the second protruding end part 122 includes: a second side wall extension 122c as a side wall part of the second protruding end part 122 which stretches in the longitudinal direction of the second housing 111 from both ends in the longitudinal direction of the second side wall part 112; and a second end wall 122b which extends in the width direction of the second housing 111 with both ends thereof connected to the second side wall extension 122c. In each second protruding end part 122, the second end wall 122b and the second side wall extension 122c connected to both ends thereof form a continuous substantially U shaped side wall and define three sides in the vicinity of both ends of a substantially rectangular recessed groove 113. In addition, in the second end wall 122b, an outer end recess 123a as a recessed second central foot housing part is formed on the outer side face. Moreover, in the second side wall extension 122c, an outer side recess 123c as a recessed second side plate housing part is formed on the outer side face.

In addition, the second reinforcing bracket 151 as a counterpart reinforcing bracket installed thereto is attached to the second housing 111. In the present embodiment, a second reinforcing bracket 151, as a member integrally formed by carrying out processing such as punching and bending on the metal plate, is positioned on both ends in the longitudinal direction (X axis direction) of the second housing 111, and includes: a pair of second body parts 152 covering the outside of the second end wall 122b of the second protruding end part 122; a second side part 153 connected to both the left and right ends of each second body part 152; and a second supporting part 157 as a counterpart supporting part serving as a counterpart coupling part which couples the second side part 153 in the vicinity of both ends in the longitudinal direction of the second housing 111.

The second body part 152 includes: a second body upper face part 152a which extends in the width direction of the second housing 111 and covers the majority of the upper face 122a of the second end wall 122b; an end wall outer cover part 152b as a second central foot which stretches downward from the outer end edge of the second end wall 122b in the second body upper face part 152a; a second central connection foot 152c which stretches downward from the lower end of this end wall outer cover part 152b; and an engagement projection 152d formed at the side end of the end wall outer cover part 152b.

In addition, with the second reinforcing bracket 151 attached to the second housing 111, the second body upper face part 152a covers the majority of the upper face 122a of the second end wall 122b, most of the end wall outer cover part 152b is housed in the outer end recess 123a, and the engagement projection 152d engages with the side wall of the outer end recess 123a so as to be fixed into the outer end recess 123a. Note that the lower end of the second central connection foot 152c protrudes downward so as to be connected to a connection pad coupled to a ground trace of the second substrate by soldering, etc. Consequently, the second reinforcing bracket 151 tends not to be deformed, with the second connector 101 effectively reinforced.

The second side part 153 includes: a second side upper face part 153a which extends in the longitudinal direction of the second housing 111 and covers the majority of the upper face of the second side wall extension 122c; a second side plate part 155 which stretches downward from the outward end in the width direction of the second housing 111 in this second side upper face part 153a; a second side plate connection foot 155a which stretches outwardly from the lower end of this second side plate part 155 to the outside in the width direction of the second housing 111; an engagement projection 155c formed at the side end of the second side plate part 155; and an engaging recess 155b as a counterpart mating guide engagement part formed so as to protrude from the outer side face of the second side plate part 155. This engagement projection 155b is a member which engages with an engaging recess 55b formed in an inner plate part 55 of the first reinforcing bracket 51 when the first connector 1 mates with the second connector 101; wherein, as long as the engagement projection 155b is engageable with the engaging recess 55b, it may be any shape and is not necessarily a projection. Moreover, the engagement projection 155b may be replaced with the engaging recess, while the engaging recess 55b formed in the inner plate part 55 of the first reinforcing bracket 51 may be replaced with the engagement projection.

In addition, with the second reinforcing bracket 151 attached to the second housing 111, the second side upper face part 153a covers the majority of the upper face of the second side wall extension 122c, the second side plate part 155 is housed in the outer side recess 123c of the second side wall extension 122c and covers a side face 123e of this outer side recess 123c, the engagement projection 155c engages with the side wall of the outer side recess 123c so as to be fixed into the outer side recess 123c, and the second side plate connection foot 155a stretches outwardly from the lower end of the second side plate part 155 so as to be connected to the connection pad coupled to the ground trace of the second substrate by soldering, etc. Consequently, the second reinforcing bracket 151 tends not to be deformed, with the second connector 101 effectively reinforced. Note that the upper face of the second side wall extension 122c is formed so as to be flush with the upper face 122a of the second end wall 122b and be lower than the upper face 112a of the second side wall part 112, while the upper face of the second side upper face part 153a covering the upper face of the second side wall extension 122c is substantially flush with the upper face 112a of the second side wall part 112.

The second supporting part 157 as the counterpart supporting part is an elongated flat belt shaped plate which extends in the thickness direction (Z axis direction) and the longitudinal direction of the second housing 111 with both ends thereof connected to and substantially flush with the second side plate part 155. Moreover, a protrusion part 157a as a counterpart supporting engagement part which extends in the longitudinal direction of the second housing 111 is formed on the outward face in the width direction of the second housing 111 in the second supporting part 157. Note that the counterpart supporting engagement part is not necessarily a protrusion such as the protrusion part 157a and may be a recessed groove, wherein a protrusion such as the protrusion part 157a will be described. Further, the protrusion part 157a, in the illustrated example, is continuously formed over substantially the overall length of the second supporting part 157, but is not necessarily formed over substantially the overall length of the second supporting part 157, may be partially formed so as to match the recessed groove 57a formed in the first supporting part 57 of the first reinforcing bracket 51, is not necessarily continuously formed, and may be intermittently formed, wherein, for convenience of description, the case of the continuous formation over substantially the overall length of the second supporting part 157 will be described.

In addition, with the second reinforcing bracket 151 attached to the second housing 111, the second supporting part 157 covers the outer side face 112d of the second side wall part 112. The inward face in the width direction of the second housing 111 in the second supporting part 157 abuts or approaches the outer side face 112d of the second side wall part 112. Accordingly, because the second side wall part 112 is reinforced by the second supporting part 157, even if the dimension in the width direction of the second housing 111 is small, that is, thin, it is not deformed. Moreover, because the second supporting part 157 has the protrusion part 157a formed therein, giving it a large section modulus and high strength, the second side wall part 112 is more effectively reinforced.

The operation for mating the first connector 1 and the second connector 101 having the abovementioned configuration will be described next.

Here, the first connector 1 is mounted on the surface of the first substrate by connecting a first tail part 62 of a first terminal 61 to the connection pad coupled to a conductive trace of a first substrate (not illustrated) by soldering, etc., and connecting the lower end of a first central connection foot 52d of the first reinforcing bracket 51, the lower end of a first side plate connection foot 54a, and the lower end of an inner plate connection foot 55a to the connection pad coupled to the conductive trace of the first substrate by soldering, etc. Note that the conductive trace coupled to the connection pad with the first tail part 62 of the first terminal 61 connected thereto is a signal line, while the conductive trace coupled to the connection pad with the lower end of the first central connection foot 52d of the first reinforcing bracket 51, the lower end of the first side plate connection foot 54a, and the lower end of the inner plate connection foot 55a connected thereto is a ground line.

Similarly, the second connector 101 is mounted on the surface of the second substrate by connecting a second tail part 162 of a second terminal 161 to the connection pad coupled to a conductive trace of a second substrate (not illustrated) by soldering, etc., and connecting the lower end of a second central connection foot 152c of the second reinforcing bracket 151 and a second side plate connection foot 155a to the connection pad coupled to the conductive trace of the second substrate by soldering, etc. Note that the conductive trace coupled to the connection pad with the second tail part 162 of the second terminal 161 connected thereto is a signal line, while the conductive trace coupled to the connection pad with the lower end of the second central connection foot 152c of the second reinforcing bracket 151 and the second side plate connection foot 155a connected thereto is a ground line.

First, when an operator makes a mating surface 11a of the first housing 11 of the first connector 1 face the mating surface 111a of the second housing 111 of the second connector 101, the position of the second side wall part 112 of the second connector 101 coincides with the position of the corresponding recessed groove 12a of the first connector 1, while the position of the second protruding end part 122 of the second connector 101 coincides with the position of the corresponding mating recess 22 of the first connector 1, thereby completing the alignment between the first connector 1 and the second connector 101.

In this state, if the first connector 1 and/or the second connector 101 are moved in the direction approaching the counterpart side, that is, the mating direction (Z axis direction), the second side wall part 112 and the second protruding end part 122 of the second connector 101 are inserted into the recessed groove 12a and the mating recess 22 of the first connector 1. Thus, as illustrated in FIGS. 1 and 7A-7D, the first terminal 61 and the second terminal 161 achieve a conduction state upon completion of the mating between the first connector 1 and the second connector 101.

Specifically, a first contact part 65a of each first terminal 61 contacts the second contact part 165a of the second terminal 161, resulting in the conductive trace coupled to the connection pad on the first substrate with the first tail part 62 of the first terminal 61 connected thereto being conducted with the conductive trace coupled to the connection pad on the second substrate with the second tail part 162 of the second terminal 161 connected thereto. Consequently, the first terminal 61 and the second terminal 161 which correspond to each other come into contact only at a single location, that is, they enter a state of a single contact point compared with contact at multiple locations, that is, a state of multiple contact points, resulting in no unintentional stub or divided circuit being formed in a signal transmission line from the first tail part 62 of the first terminal 61 to the second tail part 162 of the second terminal 161, thereby stabilizing the impedance of the transmission line. Accordingly, also in the case of using the transmission line for transmitting high frequency signals, good SI (signal to interference) characteristics can be obtained.

Moreover, the second protruding end part 122 is inserted into the mating recess 22, with the inner plate part 55 of the first reinforcing bracket 51 contacting the second side plate part 155 of the second reinforcing bracket 151. As a result, the conductive trace coupled to the connection pad on the first substrate (which is connected to the lower end of the first central connection foot 52d of the first reinforcing bracket 51, the lower end of the first side plate connection foot 54a, and the lower end of the inner plate connection foot 55a) is conducted with the conductive trace coupled to the connection pad on the second substrate (which is connected to the lower end of the second central connection 152c of the second reinforcing bracket 151 and the second side plate connection foot 155a). Moreover, the engaging recess 55b formed in the inner plate part 55 of the first reinforcing bracket 51 engages with the engagement projection 155b formed in the second side plate part 155 of the second reinforcing bracket 151, the first reinforcing bracket 51 is locked into the second reinforcing bracket 151, and the second protruding end part 122 of the second connector 101 is prevented from coming off the mating recess 22 of the first connector 1, preventing the release of the mating between the first connector 1 and the second connector 101.

Further, the second side wall part 112 of the second connector 101 is inserted into the recessed groove 12a of the first connector 1, the first supporting part 57 of the first reinforcing bracket 51 contacts the second supporting part 157 of the second reinforcing bracket 151, and the recessed groove 57a of the first supporting part 57 engages with the protrusion part 157a of the second supporting part 157. In this manner, the locked state of the first reinforcing bracket 51 and the second reinforcing bracket 151 is effectively maintained because the engaging recess 55b and the engagement projection 155b (which are positioned in the vicinity of both ends in the longitudinal direction position of the first connector 1 and the second connector 101) engage with each other, and because the recessed groove 57a and the protrusion part 157a (which are positioned closer to the center in the longitudinal direction of the first connector 1 and the second connector 101 compared with the engaging recess 55b and the engagement projection 155b, in addition to being present over a wide range in the longitudinal direction of the first connector 1 and the second connector 101) engage with each other. Accordingly, the release of the mating between the first connector 1 and the second connector 101 is securely prevented.

Moreover, as illustrated in FIG. 7C, because the cross sectional recessed shape of the recessed groove 57a is formed so as to draw a curve having a larger curvature radius than the cross sectional projection shape of the protrusion part 157a, the protrusion part 157a is stably inserted into the recessed groove 57a. Consequently, the release of the mating between the first connector 1 and the second connector 101 is more securely prevented. Note that the cross sectional shape of the recessed groove 57a and the protrusion part 157a does not necessarily include a bent curve, but may be a shape including corners and sharp portions.

Furthermore, because the recessed groove 57a and the protrusion part 157a which engage with each other are present in the longitudinal direction of the first connector 1 and the second connector 101, at locations relatively close to the first contact part 65a and the second terminal 161 of the first terminal 61 and the second contact part 165a of the second terminal 161, the contact state between the first contact part 65a of the first terminal 61 and the second contact part 165a of the second terminal 161 is stably maintained, stabilizing the impedance of all transmission lines.

Further, the first reinforcing bracket 51 and the second reinforcing bracket 151 mutually contact so as to be conducted to be equipotential, with a shield function capable of being stably exerted, allowing the first connector 1 and the second connector 101 to be effectively shielded. Further, because a shield plate part 56 covers the outside of the first housing 11 and the second housing 111 in the width direction with the first connector 1 mating with the second connector 101, the first connector 1 and the second connector 101 are very effectively shielded.

Moreover, in order to release the mating between the first connector 1 and the second connector 101, upon moving the first connector 1 and/or the second connector 101 in the direction so as to be spaced apart from the counterpart side, that is, in the opposite direction of the mating, the engaging recess 55*b* of the first reinforcing bracket 51 receives force in the direction of coming off the first housing 11, from the engagement projection 155*b* of the second reinforcing bracket 151. However, the inner plate connection foot 55*a* which stretches from the lower end of the inner plate part 55 with the engaging recess 55*b* formed therein is housed in a bottom opening 18*a* of the bottom plate 18, with the lower end thereof connected to the connection pad of the first substrate; therefore, even if subjected to force in the direction of coming off the first housing 11, it is not turned up. Moreover, the inner plate connection foot 55*a* may be housed in the bottom opening 18*a* of the bottom plate 18 without connecting the inner plate connection foot 55*a* to the connection pad of the first substrate, wherein turning up may be prevented by making the inner plate connection foot 55*a* abut the side wall of the bottom opening 18*a* or providing an engagement projection in the inner plate connection foot 55*a* to engage with the side wall of the bottom opening 18*a*. Consequently, displacement in the direction in which the first reinforcing bracket 51 comes off from the first housing 11 is blocked, improving the strength of the first reinforcing bracket 51.

As described above, in the present embodiment, the first connector 1 includes the first housing 11, the first terminal 61 installed in the first housing 11, and the first reinforcing bracket 51 installed on the first housing 11. In addition, the first housing 11 includes: a first recess 12 which mates with the second housing 111 of the second connector 101, a first side wall part 14 which extends in the longitudinal direction and defines both sides of the first recess 12, and a first protruding end part 21 which is formed on both ends in the longitudinal direction, with a mating recess 22 formed therein, wherein the second protruding end part 122 formed on both ends in the longitudinal direction of the second housing 111 is inserted into the first protruding end part 21, wherein the first reinforcing bracket 51 includes: a first body part 52 formed on both ends in the longitudinal direction, a first side part 53 which is connected to the first body part 52 and disposed on a first side wall extension 21*c* on both sides of the first protruding end part 21, and a first coupling part which extends in the longitudinal direction with both ends thereof connected to the first side part 53, wherein the first side part 53 includes the engaging recess 55*b* which is engageable with the engagement projection 155*b* formed on the second reinforcing bracket 151 installed on the second housing 111, wherein the first coupling part includes the shield plate part 56 outside the first side wall part 14 as well as the first supporting part 57 inside the first side wall part 14, and wherein the first supporting part 57 includes the recessed groove 57*a* which is engageable with the protrusion part 157*a* formed on the second supporting part 157 of the second reinforcing bracket 151.

Consequently, the engaging recess 55*b* formed in the vicinity of both ends in the longitudinal direction engages with the engagement projection 155*b* formed in the second reinforcing bracket 151, the recessed groove 57*a* (which is formed in the first supporting part 57 and positioned closer to the center in the longitudinal direction so as to be present over a wide range in the longitudinal direction of the first connector 1 and the second connector 101) engages with the protrusion part 157*a* formed in the second supporting part 157 of the second reinforcing bracket 151; therefore, the first connector 1 is securely locked to the mating second connector 101, securely maintaining the mating with the second connector 101 and improving reliability.

Moreover, the recessed groove 57*a* may be a recessed groove or a protrusion which extends in the longitudinal direction. Further, the recessed groove 57*a* may be continuously or intermittently formed in the longitudinal direction.

Further, the first supporting part 57 abuts or approaches the inner side face 14*b* of the first side wall part 14. Accordingly, the first side wall part 14 is effectively reinforced by the first supporting part 57.

Further, the shield plate part 56 is spaced apart from the outer side face 14*d* of the first side wall part 14. Accordingly, the overall first terminal 61 is positioned inside the shield plate part 56 in the width direction of the first housing 11 so as to be isolated from the outside, improving the shielding properties of the first connector 1.

Further, the first housing 11 includes the first projection 13 which is within the first recess 12 and mates with the recessed groove 113 of the second housing 111, while the first terminal 61 includes the first contact part 65*a* (which is exposed on the side face facing the first side wall part 14 in the first projection 13) and contacts the second terminal 161 of the second connector 101 only at a single location. Accordingly, the impedance of the transmission line is stabilized; moreover, in the case of using the transmission line for transmitting high frequency signals, good SI characteristics can be obtained.

Next Embodiment 2 will be described. Note that the description of elements having the same structures as those of Embodiment 1 will be omitted by being denoted by the same reference numerals. Furthermore, a description of operations and effects that are the same as those of Embodiment 1 will be omitted.

Figure 8:
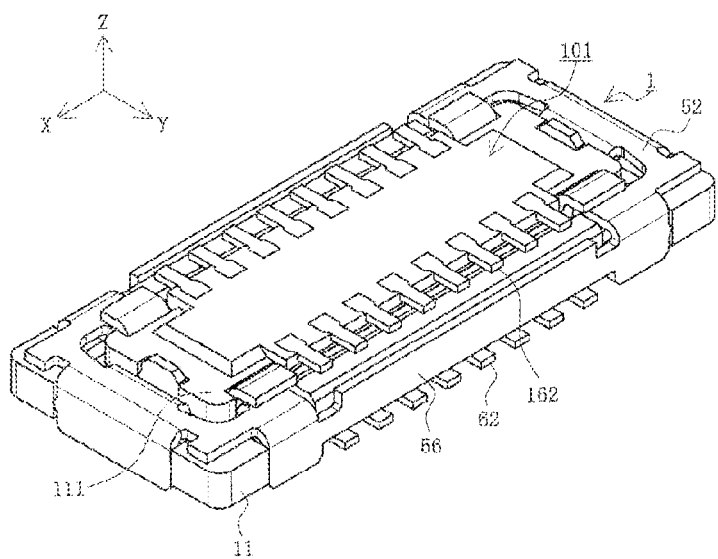
FIG. 8 is a perspective view of a state in which a first connector and a second connector according to Embodiment 2 are mated.
Figure 9:
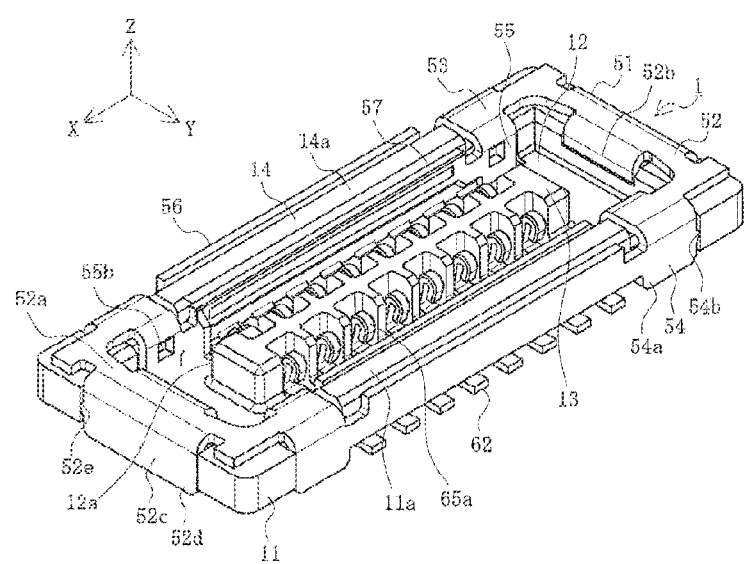
FIG. 9 is a perspective view of the first connector according to Embodiment 2.
Figure 10:
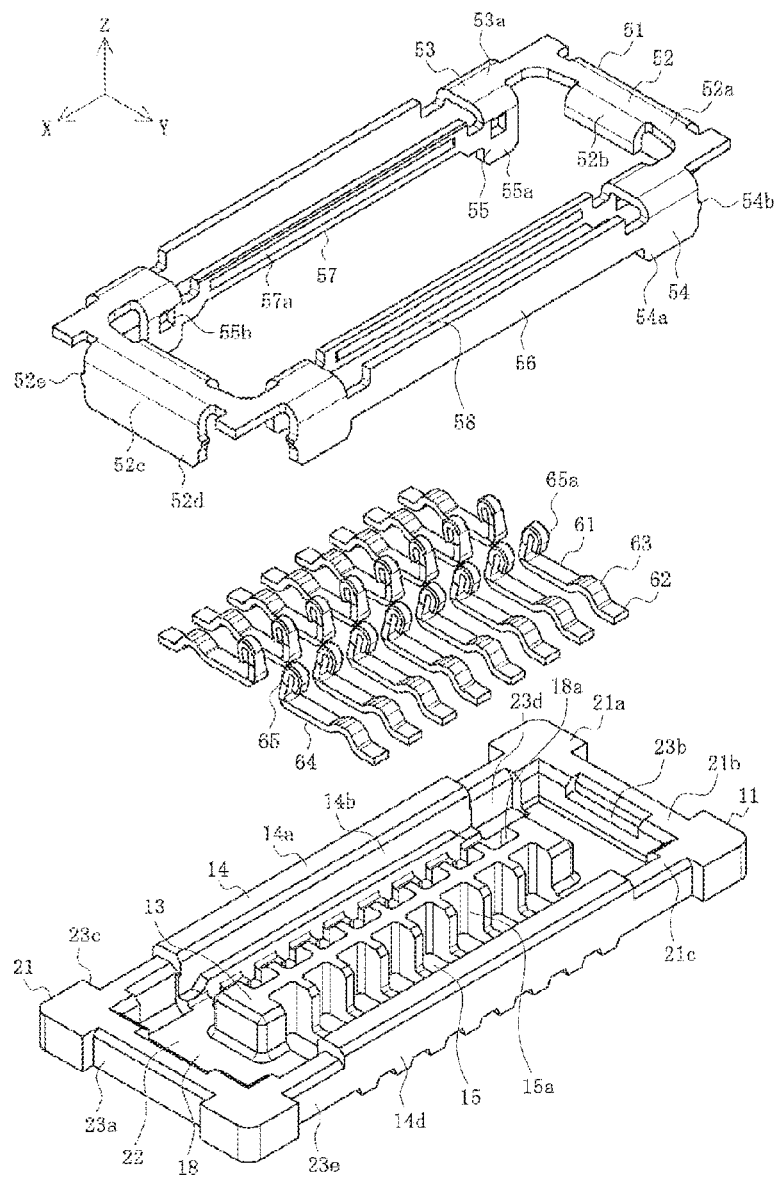
FIG. 10 is an exploded view of the first connector according to Embodiment 2.
Figure 11A:
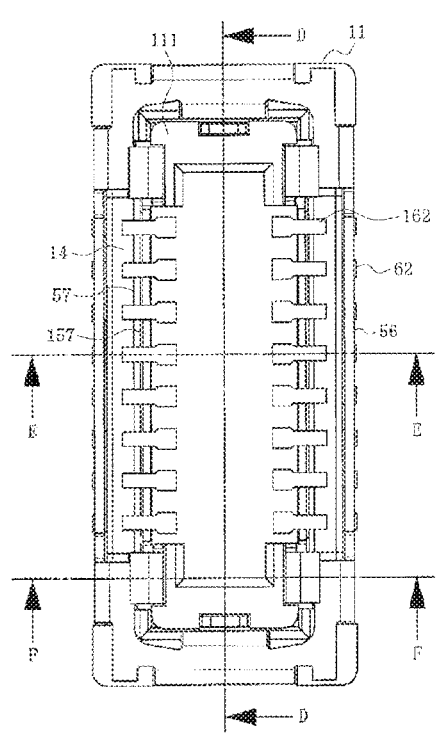
Figure 11B:
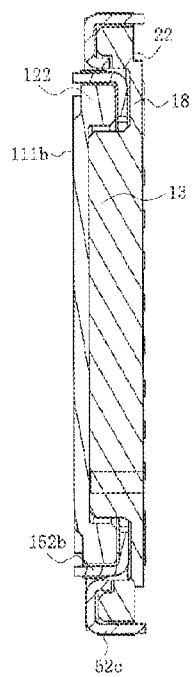
Figure 11C:
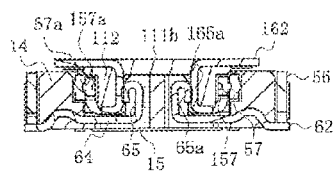
Figure 11D:
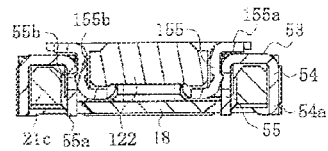
Figure 12:
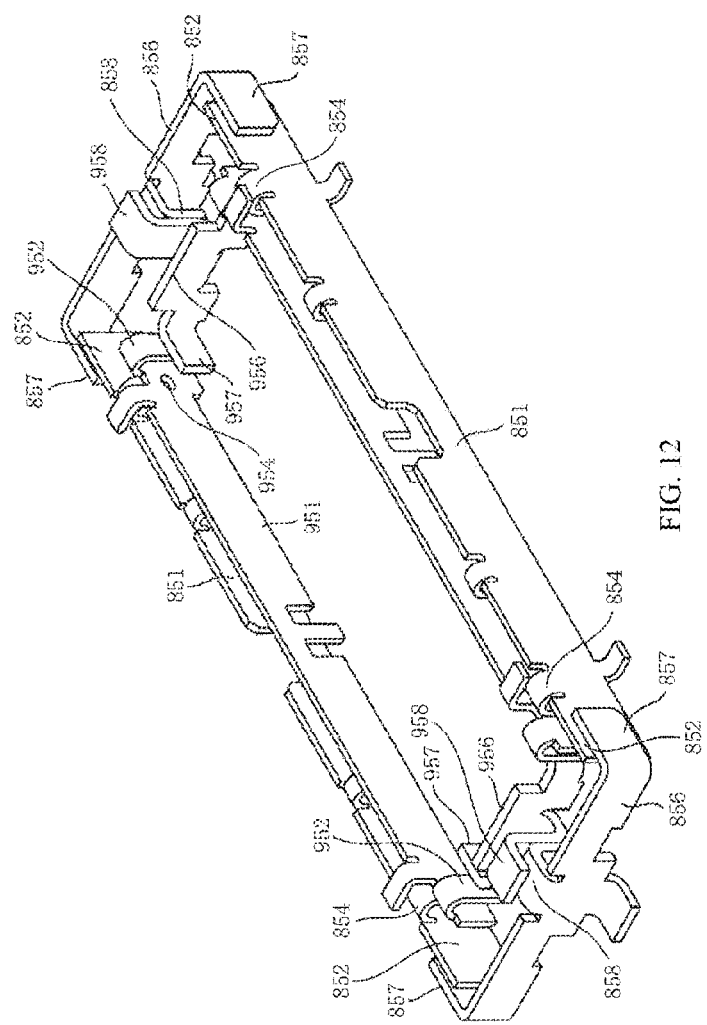
FIG. 12 is a perspective view illustrating a conventional connector shield member.

FIG. 8 is a perspective view of a state in which a first connector and a second connector according to Embodiment 2 are mated, FIG. 9 is a perspective view of the first connector according to Embodiment 2, FIG. 10 is an exploded view of the first connector according to Embodiment 2, and FIGS. 11A-11D are four plane views of a state in which the first connector and the second connector according to Embodiment 2 are mated. Note that in FIG. 11A is a plan view as seen from above the first connector, FIG. 11B is the arrow direction cross sectional view along line D-D of FIG. 11A, FIG. 11C is the arrow direction cross sectional view along line E-E of FIG. 11A, and FIG. 11D is the arrow direction cross sectional view along line F-F of FIG. 11A.

In the present embodiment, the dimension in the width direction (Y axis direction) of the first protruding end part 21 of the first housing 11, that is, the width, is set so as to be narrower than the width of the first protruding end part 21 in Embodiment 1, while the width of the first side wall extension 21*c* is set so as to be narrower than the width of the first side wall extension 21*c* in Embodiment 1 and substantially the same as the width of the first side wall part 14, with a side face 23e of an outer side recess 23c of the first side wall extension 21c substantially flush with the outer side face 14d of the first side wall part 14.

Moreover, the width of the first side part 53 of the first reinforcing bracket 51 is set so as to be narrower than the width of the first side part 53 in Embodiment 1, the interval between a first side plate part 54 and the inner plate part 55 of the first side part 53 is set so as to be narrower than the interval between the first side plate part 54 and the inner plate part 55 in Embodiment 1, and the width of a first side wall housing space 58 between the shield plate part 56 and the first supporting part 57 as the first coupling part is set so as to be narrower than the first side wall housing space 58 in Embodiment 1 and be substantially the same as the width of the first side wall part 14.

Accordingly, with the first reinforcing bracket 51 attached to the first housing 11, the outward face in the width direction of the first housing 11 in the shield plate part 56 abuts or approaches the outer side face 14d of the first side wall part 14, with side gap 58a substantially absent between the shield plate part 56 and the outer side face 14d of the first side wall part 14. Consequently, the narrowed first connector 1 can be obtained.

Note, since the other points of the configuration of the first connector 1 according to the present embodiment are the same as in Embodiment 1, a description thereof is omitted.

Note, since the configuration of the second connector 101 in the present embodiment is the same as in Embodiment 1, a description thereof is omitted.

In this manner, in the present embodiment, the shield plate part 56 abuts or approaches the outer side face 14d of the first side wall part 14. Accordingly, the first connector 1 can be narrowed.

Note that the disclosure of the present specification describes characteristics related to preferred and exemplary embodiments. Various other embodiments, modifications and variations within the scope and spirit of the claims appended hereto could naturally be conceived by persons skilled in the art by summarizing the disclosures of the present specification.

The present disclosure is applicable to a connector and a connector assembly.

The invention claimed is:

1. A connector, comprising:
    a connector body;
    a terminal installed in the connector body; and
    a reinforcing bracket installed on the connector body,
    wherein the connector body includes: a recess which mates with a counterpart connector body of a counterpart connector, a side wall part which extends in the longitudinal direction and defines both sides of the recess, and a mating guide part which is formed on both ends in the longitudinal direction, with a mating recess formed therein, wherein a counterpart mating guide part formed on both ends in the longitudinal direction of the counterpart connector body is inserted into the mating recess,
    wherein the reinforcing bracket includes: a body part formed on both ends in the longitudinal direction, a side part which is connected to the body part and disposed on a mating guide side wall part on both sides of the mating guide part, and coupling parts which extend in the longitudinal direction with both ends thereof connected to the side part, and
    wherein the side part includes a mating guide engagement part which is engageable with a counterpart mating guide engagement part formed in a counterpart reinforcing bracket installed on the counterpart connector body, the coupling parts include a shield plate part outside the side wall part as well as a supporting part inside the side wall part, and the supporting part includes a supporting engagement part which is engageable with a counterpart supporting engagement part formed in a counterpart supporting part of the counterpart reinforcing bracket.

2. The connector according to claim 1, wherein the supporting engagement part is a recessed groove or a protrusion which extends in the longitudinal direction.

3. The connector according to claim 1, wherein the supporting engagement part is continuously or intermittently formed in the longitudinal direction.

4. The connector according to claim 1, wherein the supporting part abuts or approaches the inner side face of the side wall part.

5. The connector according to claim 1, wherein the shield plate part is spaced apart from an outer side face of the side wall part.

6. The connector according to claim 1, wherein the shield plate part abuts or approaches an outer side face of the side wall part.

7. The connector according to claim 1, wherein the connector body includes a projection which is within the recess and mates with a recessed groove of the counterpart connector body, while the terminal includes a contact part which is exposed on a side face facing the side wall part in the projection and contacts a counterpart terminal of the counterpart connector at a single location.

8. A connector assembly, comprising: the connector according to claim 1, and the counterpart connector mating with the connector.

* * * * *